(12) United States Patent
Chen et al.

(10) Patent No.: US 6,300,888 B1
(45) Date of Patent: Oct. 9, 2001

(54) ENTROPHY CODE MODE SWITCHING FOR FREQUENCY-DOMAIN AUDIO CODING

(75) Inventors: Wei-ge Chen, Issaquah; Ming-Chieh Lee, Bellevue, both of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/211,531

(22) Filed: Dec. 14, 1998

(51) Int. Cl.⁷ .................................................. H03M 7/46

(52) U.S. Cl. ............................................ 341/63; 704/503

(58) Field of Search ............................. 341/50, 106, 63, 341/67, 65; 704/267, 500, 503

(56) References Cited

U.S. PATENT DOCUMENTS

| | | | |
|---|---|---|---|
| 4,133,006 | * 1/1979 | Linuma | 358/133 |
| 4,706,265 | * 11/1987 | Furukawa | 375/122 |
| 4,744,085 | 5/1988 | Fukatsu | 371/30 |
| 5,003,307 | 3/1991 | Whiting et al. | |
| 5,227,788 | 7/1993 | Johnston et al. | |
| 5,400,075 | 3/1995 | Savatier | 348/384 |
| 5,479,562 | 12/1995 | Fielder et al. | |
| 5,550,541 | 8/1996 | Todd | 358/261 |
| 5,552,832 | 9/1996 | Astle | 348/420 |
| 5,579,430 | 11/1996 | Grill et al. | 395/2.12 |
| 5,644,305 | 7/1997 | Inoue et al. | 341/67 |
| 5,742,735 | 4/1998 | Eberlein et al. | 395/2.38 |
| 5,790,706 | * 8/1998 | Auyeung | 382/248 |
| 5,819,215 | 10/1998 | Dobson et al. | 704/230 |
| 5,825,830 | 10/1998 | Kopf | 375/340 |
| 5,831,559 | 11/1998 | Agarwal et al. | 341/106 |
| 5,845,247 | * 12/1998 | Miyasaka | 704/267 |
| 5,883,589 | 3/1999 | Takashima et al. | 341/67 |

(List continued on next page.)

FOREIGN PATENT DOCUMENTS

| | | | | |
|---|---|---|---|---|
| 0283735 A2 | 9/1988 | (EP) | | H03M/7/30 |
| 0612156 A2 | 4/1989 | (EP) | | H03M/7/42 |
| 0535571 A2 | 4/1993 | (EP) | | H04L/1/41 |
| 0540350 A2 | 5/1993 | (EP) | | H03M/7/00 |
| 0830029 A2 | 3/1998 | (EP) | | H03M/7/00 |
| 62247626 | 10/1987 | (JP) | | H03M/7/40 |
| 09232968 | 9/1997 | (JP) | | H03M/7/40 |
| WO 98/40969 | 9/1998 | (WO) . | | |

OTHER PUBLICATIONS

ISO/IEC 13818–7: Information Technology—Generic coding of moving pictures and associated audio information—Part 7: Advanced Audio Coding, pp. i–iv, 1–147 (1997).

(List continued on next page.)

*Primary Examiner*—Peguy Jeanpierre
(74) *Attorney, Agent, or Firm*—Klarquist Sparkman, LLP

(57) ABSTRACT

A frequency-domain audio coder selects among different entropy coding modes according to characteristics of an input stream. In particular, the input stream is partitioned into frequency ranges according to some statistical criteria derived from a statistical analysis of typical or actual input to be encoded. Each range is assigned an entropy encoder optimized to encode that range's type of data. During encoding and decoding, a mode selector applies the correct entropy method to the different frequency ranges. Partition boundaries can be decided in advance, allowing the decoder to implicitly know which decoding method to apply to encoded data. Or, adaptive arrangements may be used, in which boundaries are flagged in the output stream by indicating a change in encoding mode for subsequent data. For example, one can create a partition boundary which separates out primarily zero quantized frequency coefficients, from primarily non-zero quantized coefficients, and then apply a coder optimized for such data. An overall more efficient process is achieved by basing coding methods according to the properties of the input data. In practice, the number of partitions and frequency ranges will vary according to the type of data to be encoded and decoded.

30 Claims, 9 Drawing Sheets

U.S. PATENT DOCUMENTS

| | | | |
|---|---|---|---|
| 5,884,269 | | 3/1999 | Cellier et al. ........................ 704/501 |
| 5,926,791 | * | 7/1999 | Ogata et al. ........................ 704/500 |
| 5,946,043 | | 8/1999 | Lee et al. ............................ 348/420 |
| 5,959,560 | | 9/1999 | Said et al. ........................... 341/107 |
| 6,029,126 | * | 2/2000 | Malvar ................................. 704/204 |
| 6,223,162 | * | 4/2001 | Chen et al. .......................... 704/503 |

OTHER PUBLICATIONS

ISO/IEC 13818-7: Information Technology—Generic coding of moving pictures and associated audio information—Part 7: Advanced Audio Coding, Technical Corrigendum 1, pp. 1–22 (Dec. 1998).

Video Coding For Low Bitrate Communication, "Line Transmission of Non–Telephone Signals," Telecommunication Standardization Sector of International Telecommunication Union, Dec. 5, 1995, pp. 22–23.

Allen Gersho and Robert M. Gray, *Vector Quantization and Signal Compression*, "Entropy Coding," 1992, Chap. 9, pp. 259–305.

"Information Technology—Very Low Bitrate Audio–Visual Coding," Part 3: Audio, ISO/JTC1/SC29, N2203, May 15, 1998, pp. 4–9, including section on Huffman Coding.

International Organisation for Standardisation Organisation Internationale De Normalisation, ISO/IEC JTC1/SC29/WG11, N2202, Coding of Moving Pictures and Audio, Tokyo, Mar. 1998.

Stanley N. Baron, Mark I. Krivocheev, "Coding the Audio Signal," *Digital Image and Audio Communications*, 1996, pp. 101–128.

Fogg, "Survey of Software and Hardware VLC Architectures," SPIE vol. 2186, pp. 29–37 (no date of publication).

Gibson et al., *Digital Compression of Multimedia*, "Lossless Source Coding," Chapter 2, pp. 17–61 (1998).

Gibson et al., *Digital Compression of Multimedia*, "Universal Lossless Source Coding," Chapter 3, pp. 63–112 (1998).

Gibson et al., *Digital Compression of Multimedia*, "MPEG Audio," Chapter 11.4, pp. 398–402 (1998).

Gibson et al., *Digital Compression of Multimedia*, "Advanced Audio Coding," Chapter 11.6.2, pp. 415–416 (1998).

Gibson et al., *Digital Compression of Multimedia*, "Frequency Domain Coding," Chapter 7, pp. 227–262 (1998).

Gibson et al., *Digital Compression of Multimedia*, "Frequency Domain Speech and Audio Coding Standards," Chapter 8, pp. 263–290 (1998).

International Organization for Standardisation ISO/IEC JTCI/SC29/WG11,N2459 "Overview of the MPEG–4 Standard," (Oct. 1998).

Bially et al., "A Technique for Adaptive Voice Flow Control in Integrated Packet Networks," IEEE Trans. On Communications, vol. COM–28, No. 3, pp. 325–333 (1980).

Bove et al., "Cheops: A Modular Processor for Scalable Video Coding," SPIE Visual Communications and Image Processing, vol. 1605, pp. 886–893 (1991).

Douglas et al, "Statistical Analysis of the Output Rate of a Sub–band Video Coder," SPIE Visual Communications and Image Processing, vol. 1001, pp. 1011–1025 (1988).

Ghanbari et al., "Two–layer Coding of Video Signals for VBR Networks," IEEE JSAC, vol. 7, No. 5, pp. 771–781 (1989).

Karlsson et al., "Packet Video and Its Integration into the Network Architecture," IEEE JSAC, vol. 7, No. 5, pp. 739–751 (1989).

Karlsson et al., "Subband Coding of Video for Packet Networks," Optical Engineering, vol. 27, No. 7, pp. 574–586 (1988).

Tewfik et al., "Enhanced Wavelet Based Audio Coder," Proc. ASILOMAR Conference, IEEE (1993).

Cohn et al., "Ziv–Lempel Compressors with Deferred Innovation," in *Image and Text Compression*, ed. James Storer, Kluwer Academic Publishers, pp. 145–158 (1992).

Image Processing Lab, City University of Hong Kong, "Auditory Predictive Lossy Lempel–Ziv Algorithm for Speech Coding: Theory," 40 pp. [online] [retrieved on Nov. 21, 2000 from http://www.image.cityu.edu.hk/~stkng/].

* cited by examiner

600 — A  8/15 Expand
602 — X0=B,C  7/15

606  2/9
608  4/9 Keep
610  0/9

608  4/9 Expand
612  2/9
      3/9

614  1/8 Keep
616  1/8
618  0/8
     3/8
     3/8

ENTROPHY CODE MODE SWITCHING FOR FREQUENCY-DOMAIN AUDIO CODING

FIELD OF THE INVENTION

The invention generally relates to frequency domain audio coding, and more specifically relates to entropy coding methods used in frequency domain audio encoders and decoders.

BACKGROUND

In a typical audio coding environment, data is formatted, if necessary (e.g., from an analog format) into a long sequence of symbols which is input to an encoder. The input data is encoded by an encoder, transmitted over a communication channel (or simply stored), and decoded by a decoder. During encoding, the input is pre-processed, sampled, converted, compressed or otherwise manipulated into a form for transmission or storage. After transmission or storage, the decoder attempts to reconstruct the original input.

Audio coding techniques can be categorized into two classes, namely the time-domain techniques and frequency-domain ones. Time-domain techniques, e.g., ADPCM, LPC, operate directly in the time domain while the frequency-domain techniques transform the audio signals into the frequency domain where compression is performed. Frequency-domain codecs (compressors/decompressors) can be further separated into either sub-band or transform coders, although the distinction between the two is not always clear. That is, sub-band coders typically use band-pass filters to divide an input signal into a small number (e.g., four) of sub-bands, whereas transform coders typically have many sub-bands (and therefore a correspondingly large number of transform coefficients).

Processing an audio signal in the frequency domain is motivated by both classical signal processing theories and the human psychoaoustics model. Psychoacoustics take advantage of known properties of the listener in order to reduce information content. For example, the inner ear, specifically the basilar membrane, behaves like a spectral analyzer and transforms the audio signal into spectral data before further neural processing proceeds. Frequency-domain audio codecs often take advantage of auditory masking that is occurring in the human hearing system by modifying an original signal to eliminate information redundancies. Since human ears are incapable of perceiving these modifications, one can achieve efficient compression without distortion.

Masking analysis is usually conducted in conjunction with quantization so that quantization noise can be conveniently "masked". In modern audio coding techniques, the quantized spectral data are usually further compressed by applying entropy coding, e.g., Huffman coding. Compression is required because communication channels usually have limited available capacity or bandwidth. It is frequently necessary to reduce the information content of input data in order to allow it to be reliably transmitted, if at all, over the communication channel.

Tremendous effort has been invested in developing lossless and lossy compression techniques for reducing the size of data to transmit or store. One popular lossless technique is Huffman encoding, which is a particular form of entropy encoding. Entropy coding assigns code words to different input sequences, and stores all input sequences in a code book. The complexity of entropy encoding depends on the number m of possible values an input sequence X may take. For small m, there are few possible input combinations, and therefore the code book for the messages can be very small (e.g., only a few bits are needed to unambiguously represent all possible input sequences). For digital applications, the code alphabet is most likely a series of binary digits {0, 1 }, and code word lengths are measured in bits.

If it is known that input is composed of symbols having equal probability of occurring, an optimal encoding is to use equal length code words. But, it is not typical that an input stream has equal probability of receiving any particular message. In practice, certain messages are more likely than others, and entropy encoders take advantage of such data correlation to minimize the average length of code words among expected inputs. Traditionally, however, fixed length input sequences are assigned variable length codes (or conversely, variable length sequences are assigned fixed length codes).

SUMMARY

The invention relates to a method for selecting an entropy coding mode for frequency-domain audio coding. In particular, a given input stream representing audio input is partitioned into frequency ranges according to some statistical criteria derived from a statistical analysis of typical or actual input to be encoded. Each range is assigned an entropy encoder optimized to encode that range's type of data. During encoding and decoding, a mode selector applies the correct entropy method to the different frequency ranges. Partition boundaries can be decided in advance, allowing the decoder to implicitly know which decoding method to apply to encoded data. Or, a forward adaptive arrangement may be used, in which boundaries are flagged in the output stream by indicating a change in encoding mode for subsequent data.

For natural sounds, such as speech and music, information content is concentrated in the low frequency range. This means that, statistically, the lower frequencies will have more non-zero energy values (after quantization), while the higher frequency range will have more zero values to reflect the lack of content in the higher frequencies. This statistical analysis can be used to define one or more partition boundaries separating lower and higher frequency ranges. For example, a single partition can be defined such that the lower ¼ of the frequency components are below the partition. Alternatively, one can set the partition so that approximately one-half of the critical bands are in each defined frequency band. (Critical bands are frequency ranges of non-uniform width that correspond to the human auditory system's sensitivity to particular frequencies.) The result of such a division is to define two frequency ranges, in which one contains predominately non-zero frequency coefficients, while the other contains predominately zero frequency coefficients. Advance knowledge that the ranges containing predominately zero and non-zero values can be encoded with encoders optimized for such zero and non-zero values.

In one implementation, the range containing predominately zero values is encoded with a multi-level run-length encoder (RLE), i.e., an encoder that statistically correlates sequences of zero values with one or more non-zero symbols and assigns variable length code words to arbitrarily long input sequences of such zero and non-zero values. Similarly, the range containing mostly non-zero values is encoded with a variable-to-variable entropy encoder, where a variable length code word is assigned to arbitrarily long input sequences of quantization symbols. An overall more efficient process is achieved by basing coding methods according to the properties of the input data. In practice, the number of partitions and frequency ranges will vary according to the type of data to be encoded and decoded.

DETAILED DESCRIPTION

Exemplary Operating Environment

Figure 1:
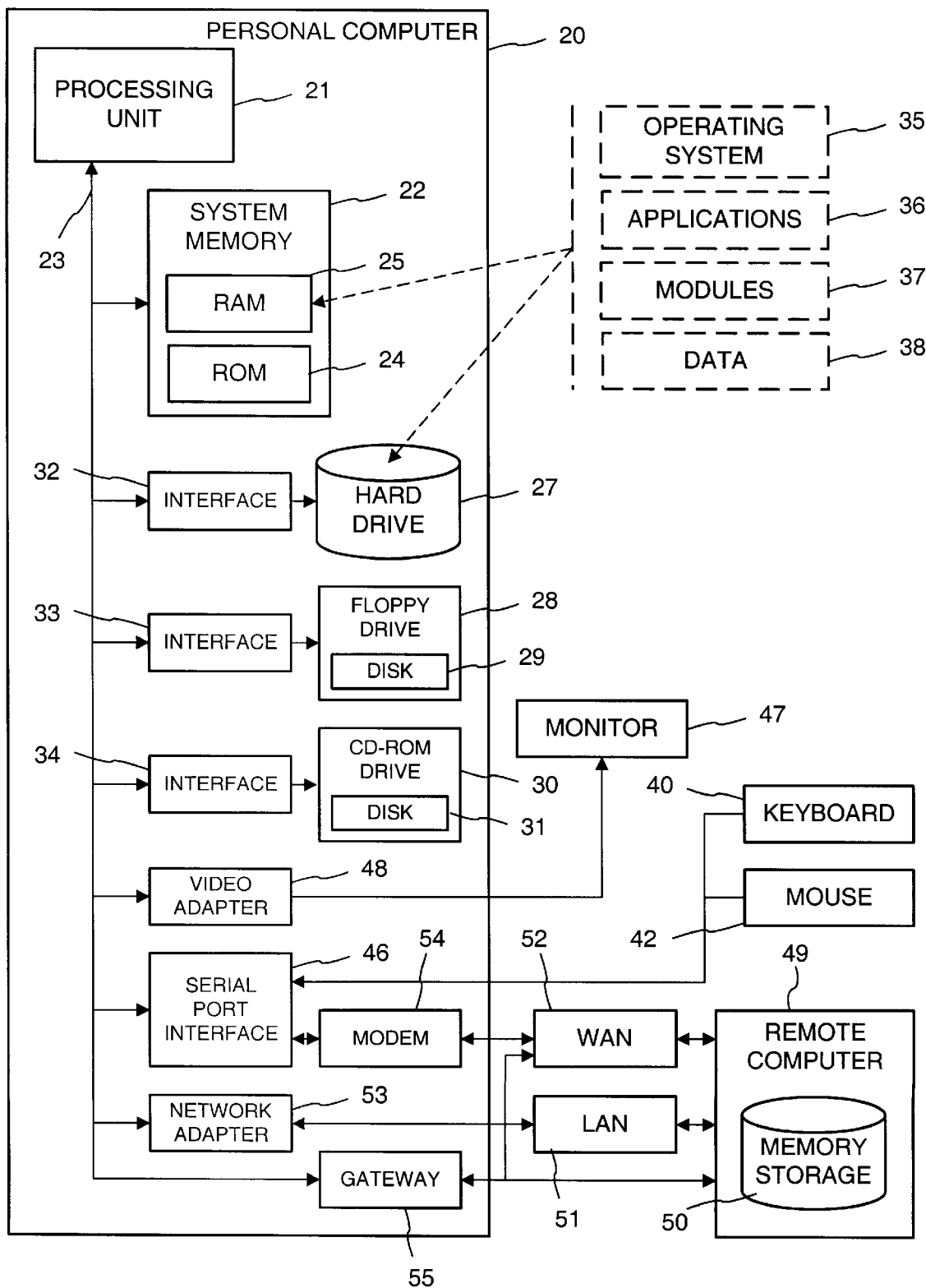
FIG. 1 is a block diagram of a computer system that may be used to implement frequency domain audio coding and decoding that employs entropy code mode switching.

FIG. 1 and the following discussion are intended to provide a brief, general description of a suitable computing environment in which the invention may be implemented. While the invention will be described in the general context of computer-executable instructions of a computer program that runs on a personal computer, those skilled in the art will recognize that the invention also may be implemented in combination with other program modules. Generally, program modules include routines, programs, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The illustrated embodiment of the invention also is practiced in distributed computing environments where tasks are performed by remote processing devices that are linked through a communications network. But, some embodiments of the invention can be practiced on stand alone computers. In a distributed computing environment, program modules may be located in both local and remote memory storage devices.

With reference to FIG. 1, an exemplary system for implementing the invention includes a computer 20, including a processing unit 21, a system memory 22, and a system bus 23 that couples various system components including the system memory to the processing unit 21. The processing unit may be any of various commercially available processors, including Intel x86, Pentium and compatible microprocessors from Intel and others, the Alpha processor by Digital, and the PowerPC from IBM and Motorola. Dual microprocessors and other multi-processor architectures also can be used as the processing unit 21.

The system bus may be any of several types of bus structure including a memory bus or memory controller, a peripheral bus, and a local bus using any of a variety of conventional bus architectures such as PCI, AGP, VESA, Microchannel, ISA and EISA, to name a few. The system memory includes read only memory (ROM) 24 and random access memory (RAM) 25. A basic input/output system (BIOS), containing the basic routines that help to transfer information between elements within the computer 20, such as during start-up, is stored in ROM 24.

The computer 20 further includes a hard disk drive 27, a magnetic disk drive 28, e.g., to read from or write to a removable disk 29, and an optical disk drive 30, e.g., for reading a CD-ROM disk 31 or to read from or write to other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of data, data structures, computer-executable instructions, etc. for the computer 20. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment.

A number of program modules may be stored in the drives and RAM 25, including an operating system 35, one or more application programs (e.g., Internet browser software) 36, other program modules 37, and program data 38.

A user may enter commands and information into the computer through a keyboard 40 and pointing device, such as a mouse 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers.

The computer 20 is expected to operate in a networked environment using logical connections to one or more remote computers, such as a remote computer 49. The remote computer 49 may be a web server, a router, a peer device or other common network node, and typically includes many or all of the elements described relative to the computer 20, although only a memory storage device 50 has been illustrated in FIG. 1. The computer 20 can contact the remote computer 49 over an Internet connection established through a Gateway 55 (e.g., a router, dedicated-line, or other network link), a modem 54 link, or by an intra-office local area network (LAN) 51 or wide area network (WAN) 52. It will be appreciated that the network connections shown are exemplary and other means of establishing a communications link between the computers may be used.

In accordance with the practices of persons skilled in the art of computer programming, the present invention is described below with reference to acts and symbolic representations of operations that are performed by the computer 20, unless indicated otherwise. Such acts and operations are sometimes referred to as being computer-executed. It will be appreciated that the acts and symbolically represented operations include the manipulation by the processing unit 21 of electrical signals representing data bits which causes a resulting transformation or reduction of the electrical signal representation, and the maintenance of data bits at memory locations in the memory system (including the system memory 22, hard drive 27, floppy disks 29, and CD-ROM 31) to thereby reconfigure or otherwise alter the computer system's operation, as well as other processing of signals. The memory locations where data bits are maintained are physical locations that have particular electrical, magnetic, or optical properties corresponding to the data bits.

Figure 2:
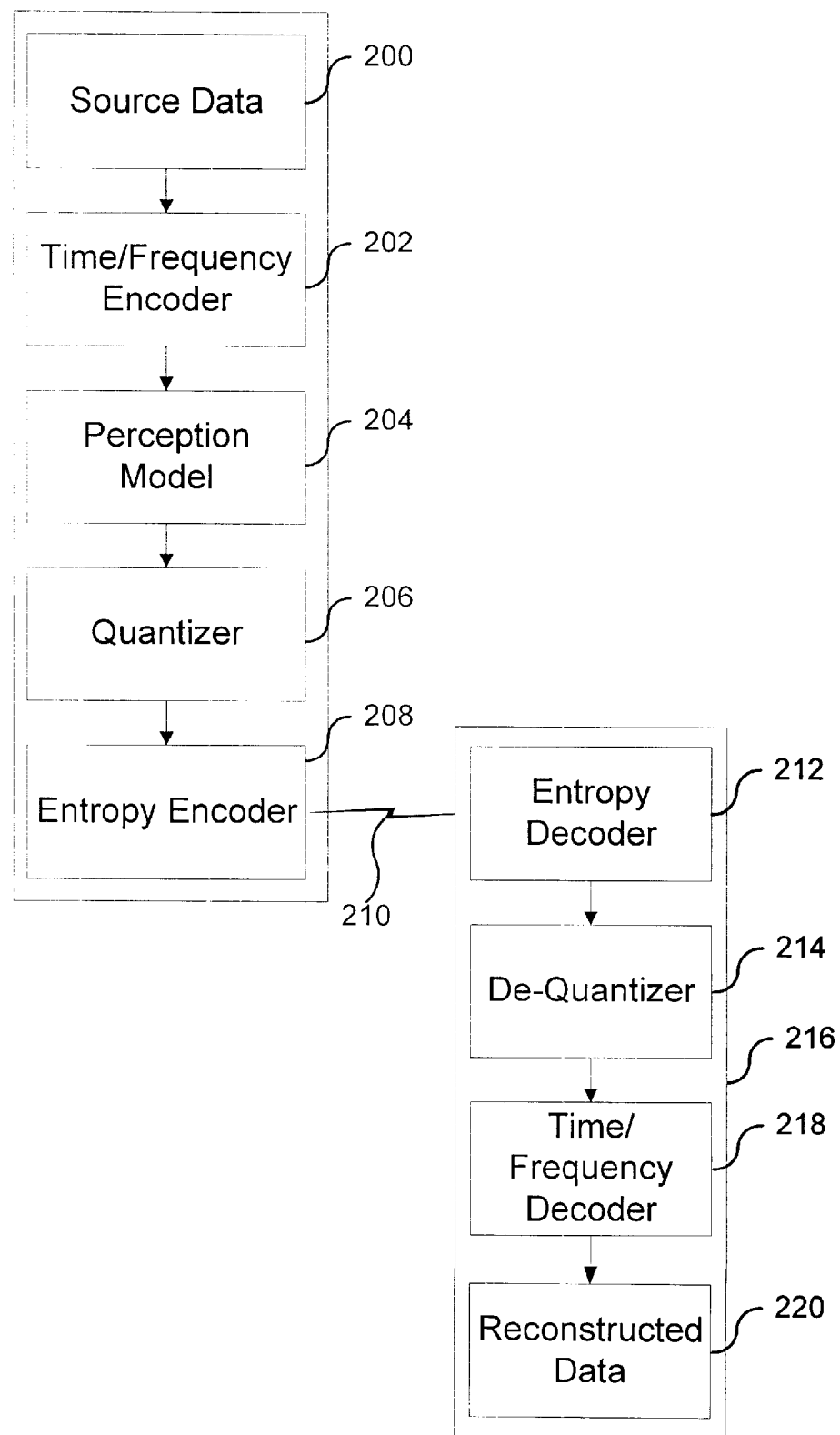
FIG. 2 is a flow chart showing encoding and decoding audio data in a frequency domain audio coder.

FIG. 2 shows a transmission model for transmitting audio data over a channel 210. The source of the transmission may be a live broadcast, stored data, or information retrieved over wired/wireless communication link (e.g., a LAN or the Internet). It is presumed that the channel 210 is of limited bandwidth, and therefore compression of source data 200 is desirable before data can be reliably sent over the channel. Note that although this discussion focuses on transmission of audio data, the invention applies to transfer of other data, such as audio visual information having embedded audio data (e.g., multiplexed within an MPEG data stream), or other data sources having compressible data patterns (e.g., coherent data).

As illustrated, source data 200 is input to a time/frequency transform encoder 202 such as a filter bank or discrete-cosine type transform. Transform encoder 202 is designed so as to convert a continuous or sampled time-domain input, such as an audio data source, into multiple frequency bands of predetermined (although perhaps differing) bandwidth. These bands can then be analyzed with respect to a human auditory perception model 204 (for example, a psychoacoustic model) in order to determine components of the signal that may be safely reduced without audible impact. For example, it is well known that certain frequencies are inaudible when certain other sounds or frequencies are present in the input signal (simultaneous masking). Consequently, such inaudible signals can be safely removed from the input signal. Use of human auditory models is well known, e.g., the MPEG 1, 2 and 4 standards. (Note that such models may be combined into a quantization 206 operation.) After performing the time/frequency transformation 202, frequency coefficients within each range are quantized 206 to convert each coefficient (amplitude levels) to a value taken from a finite set of possible values, where each value has a size based on the bits allocated to representing the frequency range. The quantizer may be a conventional uniform or non-uniform quantizer, such as a midriser or midtreader quantizer with (or without) memory. The general quantization goal is identifying an optimum bit allocation for representing the input signal data, i.e., to distribute usage of available encoding bits to ensure encoding the (acoustically) significant portions of the source data. Various quantization methods, such as quantization step size prediction to meet a desired bit rate (assuming constant bit rate) can be used. After the source 200 has been quantized, the resultant data is then entropy encoded 208 (see discussion for FIGS. 6–13).

The entropy encoded output is transmitted over the communication channel 210 (or stored for later transmission). The receiving end 216 then implements a reverse-encoding process, i.e., a series of steps to undo the encoding of the source data 200. That is, encoded data is received over the channel 210 as input to an entropy decoder 212 which performs a reverse code book look-up to convert the encoded output into an approximation of the original quantization output for the input symbol series 200. This approximate data is then processed by a de-quantizer 214 and a time/frequency transform decoder 218 to reverse the original coding operations, resulting in a reconstructed data 220 that is similar to the original source data 200. It should be noted that the reconstructed data 220 only approximates the original source data 200 since applying steps 204–208 is a lossy process.

One possible implementation for this transmission model is a client application program wanting to process, display or play real-time data as it is retrieved over a network link from a server/serving application. For example, the client can use a streaming delivery system that provides adaptive bandwidth reservation. (One such streaming format is the Microsoft Advanced Streaming Format.) A streaming environment contrasts traditional networking programs by allowing data delivery to be optimized for particular retrieval needs, such as line speed constraints. A distinguishing feature of streaming data is that data can be viewed progressively in real time as a client receives it. Note that it is intended that processed data can be stored for later retrieval by a client, and that such retrieval can be performed in a non-streaming format (e.g., by a small playback appliance).

The streaming format defines the structure of synchronized object data streams, and allows any object, e.g., audio and video data objects, scripts, ActiveX controls, and HTML documents, to be placed into a data stream. An Application Programming Interface (one such API is the Microsoft Audio Compression Manager) is provided to facilitate application support for the streaming format. Transmission of streaming format data over the communication channel 210 requires that the source information be converted into a form suitable for the network. But, unlike traditional packets which contain routing information and data, streaming packets contain a prioritized mix of data from different objects within the stream, so that the bandwidth can be first allocated to higher priority objects. On the receiving end 216, the objects within the prioritized data stream are reconstructed for use by the receiver.

Because data is probably being used as it is received, streaming content is susceptible to transmission delays. If data does not arrive reliably, or if transmission speed falls below an acceptable minimum, the data might become unusable (e.g., playback of a video sequence may fail). Consequently, bandwidth intensive data (such as audio feeds) needs significant compression to ensure its bandwidth requirements can be met by the communication channel 210. As the degree of lossy compression necessarily impacts the quality of the reproduced signal, a server should provide selectable encodings for different client network connection speeds (or use an adaptive feedback system to discern real-time throughput).

A particularly effective method for encoding the frequency coefficients source data 200 to ensure reliable transmission over the communication channel 210 is entropy encoding. As discussed below, one can capitalize on the data coherency by applying different encoding methods optimized for different parts of the input data. Entropy encoding is effective when symbols have non-uniform probability distribution. Entropy coding methods that group many input symbols, such as the variable-to-variable and RLE coders discussed below, are good at capitalizing on data coherency. Using different encoding methods for different frequency ranges allows for more-optimal encoding when the encoders are tailored to probability distributions for each such range.

Figure 3:
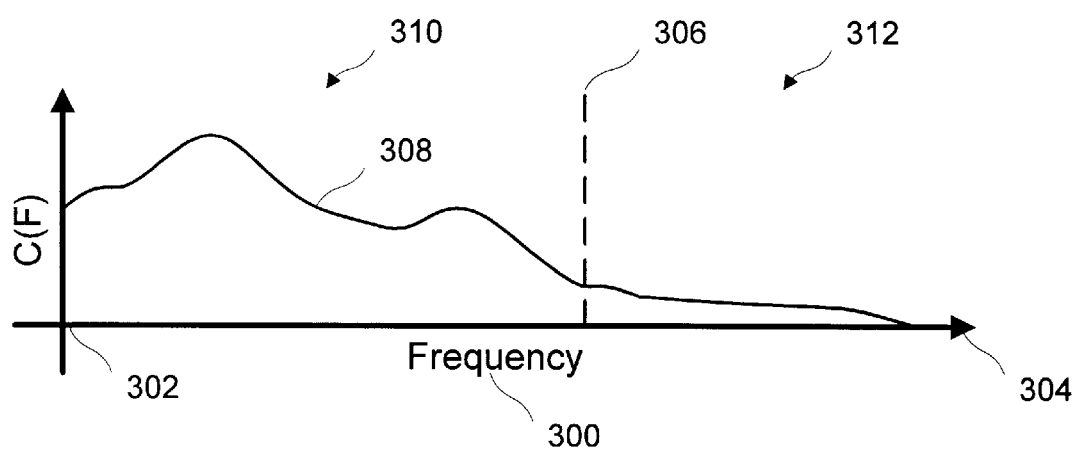
FIG. 3 illustrates a frequency range divided according to audio

FIG. 3 illustrates a time domain signal that has been converted to the frequency domain. Along the X axis is a range 300 of frequencies from zero 302 through a maximum frequency 304. A partition 306 has been defined within the range 300, where the partition is determined according to statistical analysis of an expected input stream (e.g., statistical information obtained while training an entropy code book, or by adaptive analysis of the actual input), and this statistical model is applied against actual input 308 for encoding.

One approach to setting a partition is, as discussed above, is placing a certain percentage of frequencies or critical bands below the boundary.

An alternate method is to collect basic statistics, such as the probability of zeros and non-zeros according to the probability distributions for each frequency. Inspection of each frequency's statistics shows a gradual change across frequencies, and a partition boundary can be selected so that distributions within each partition are similar. Note that the frequency partition is sensitive to the sampling rate of the input and the expected bit rate. The sampling rate and the bit rate determine the stochastic property of the quantized frequency coefficients, and this property is basically responsible for determining partition placement.

A more optimal method is to adaptively locate a partition by performing an exhaustive search to determine an "optimal" boundary location. That is, an optimal solution is to try every frequency (or subset thereof) as a partition location, perform entropy coding, and track which boundary potential position yielded a minimum number of bits for encoding. Although computationally more intensive, if computation costs are at issue, the compression benefits of an exhaustive search (or near exhaustive if frequency subsets are used) can outweigh costs when multiple partitions are used.

By separating out the frequency spectrum 300 into separate frequency sub-ranges 310, 312, an encoder can apply different encoding schemes that have been optimized to encode the different frequency ranges. This contrasts previous methods, such as entropy encoding schemes that substituted different entropy coding tables according to characteristics of data to be encoded. Such prior methods are limited by the flexibility of their single entropy encoding algorithm, by the inability of an encoding table to account for different kinds of input data, and by the overhead associated with identifying when different tables should be used. A method optimized for one type of data can not be efficiently applied to a different type of data.

In the illustrated embodiment, the selected dividing criteria for the range 300 is the probability C(F) (Y-axis) that a particular spectral event is a run of coefficients at or near a particular intensity (e.g., zero). As with code book generation, the probability of receiving zero value data can be pre-computed with respect to exemplary input. As illustrated, the input signal 308 has high probability of being zero after the indicated partition 306. (The position of the partition divider 306 was chosen so that 80% or 90% of the input beyond the divider would be at or near zero.)

It is assumed that, at a minimum, an input signal 308 is divided into two ranges, each range having data characteristics best-suited to compression by different encoding methods. In the illustrated embodiment, one range has primarily zero values, while the other has primarily non-zero values. Thus, two encoders are used, each optimized for the type of data within its corresponding range. While the illustrated implementation partitions the frequency coefficients into two ranges, more than two ranges can be defined, each having its own optimized encoder, or different ranges can share similar characteristics and thus utilize the same encoder.

Figure 11:
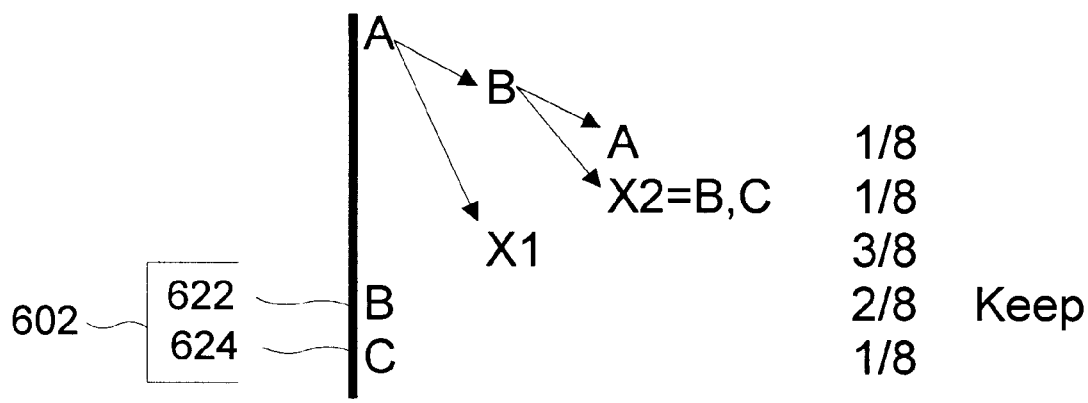
Figure 12:
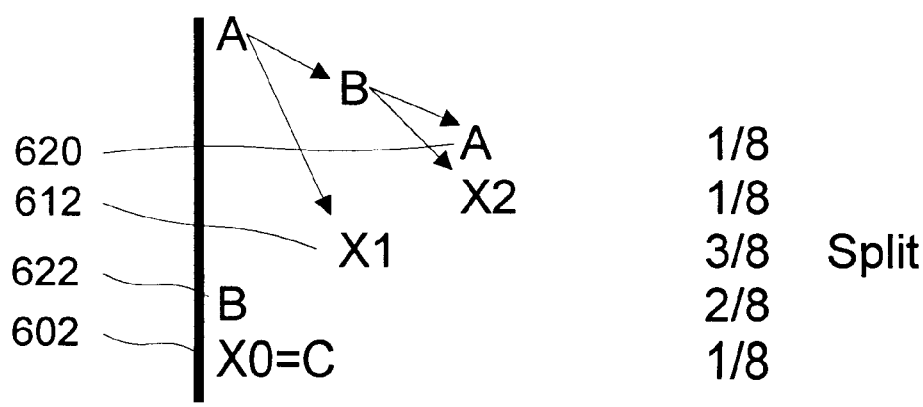
Figure 13:
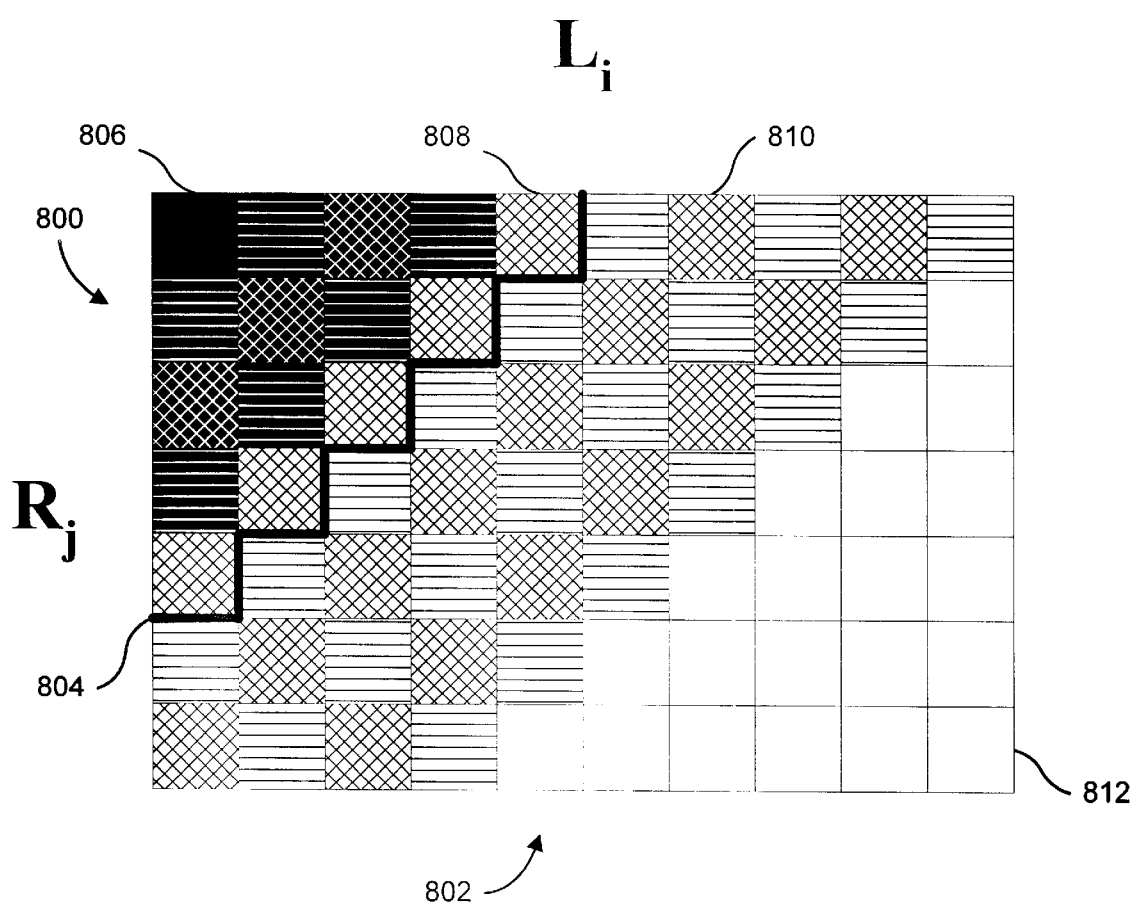
FIG. 13 illustrates a spectral threshold grid used in encoding audio sequences having repeating spectral coefficients.

For encoding the mostly non-zero range 310, an entropy coder such as that discussed for FIGS. 6–13 may be used. As discussed below, the FIGS. 6–13 coding method is particularly well suited to encoding non-zero auditory input data. For the mostly zero-value range 312, an encoder optimized for such data is used. In the illustrated embodiment, a run length encoder is used as it is optimized for encoding data that has a predominate value (e.g., zero). FIG. 13 illustrates one RLE-based entropy encoder that can efficiently encode the mostly zero valued range 312.

Figure 4:
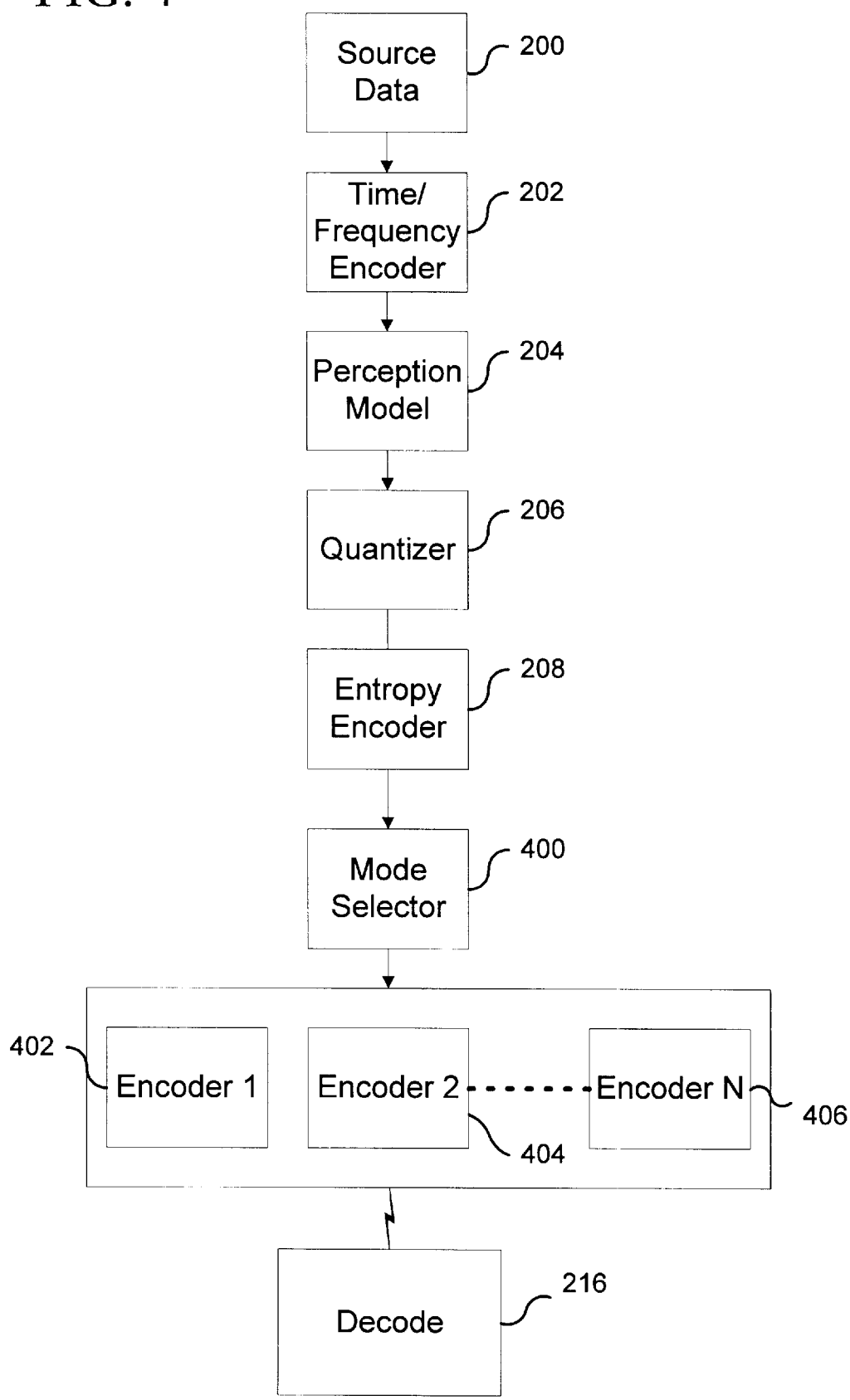
FIG. 4 illustrates an that employs entropy coding mode switching.

FIG. 4 illustrates a transmission model for transmitting audio data over a channel (see FIG. 2), in which multiple entropy encoding/decoding methods are used to manipulate input data 200. It is known that the source audio data 200 will have values within some frequency range. As discussed above for FIG. 2, source data 200 may be converted 202 into the frequency domain, reduced according to psycho-acoustic models 204, and quantized 206. Since quantization may produce significant numbers of near zero output values, an entropy encoder 208 can be optimized to encode this quantization output.

After quantization, the spectral coefficients for the quantized data tend to track the information content of typical audio data. Analysis of the quantization coefficients shows they are most likely non-zero at lower frequency ranges, and mostly zero coefficients at higher frequencies. Therefore, for frequency partitions located at certain frequency positions, a mode selector 400 can determines which encoder to according to the frequency range being encoded.

Determining placement of the partition can be based on a statistical analysis identifying which of several known entropy encoders will achieve better coding efficiency for different sub-ranges. In one configuration, analysis is performed in advance of encoding or decoding with respect to exemplary input. This allows for pre-determination of partition locations, and corresponding encoders for each sub-range, so that no overhead needs to be introduced to flag changes in applicable coders.

Alternatively, statistical analysis may be performed on current data (in real time or off-line). In this configuration, although the encoders/decoders are known in advance, a flag needs to be embedded into the encoded data stream to indicate changes in applicable coders. As discussed above, different potential partition locations can be tried until a certain degree of coding efficiency is achieved for each sub-range. Receipt by a decoder of the flag indicates the end of a sub-range, and the value of the flag indicates which decoder to use for successive data.

Although inserting markers adds some overhead to the encoding/decoding process, such markers represent an improvement over prior-art encoding methods. For example, compare illustrated embodiments with traditional (see, e.g., MPEG 1, 2, and 4) entropy encoding of audio data. A traditional system uses a single entropy encoder for all data, where different code books are associated with each of many critical bands in the input data's frequency range (usually 24 or more bands, depending on the sampling rate). At each critical band transition, assuming 24 bands, a 2 bit (or longer) flag is required to indicate which of 24 code books are to be used to encode the band's data. (5 bits are required to track 24 states, but this flag can itself be encoded into effectively fewer bits.) This sharply contrasts the illustrated embodiments which either require no flag at all, or which uses flags, but is more efficient over prior methods unless the number of sub-ranges becomes comparable to the number of critical bands, and the number of encoding methods approaches the number of tables. That is, in every encoding using critical bands, there will be 24 sub-ranges requiring a 2–5 bit flag to indicate which encoding table to use. In contrast, illustrated embodiments may only have 2 or three sub-ranges, thus much less overhead.

As shown, there are N pre-defined encoders 402–406, each optimized to encode a frequency range having data with some predominate characteristic. This does not mean that there are necessarily N distinct input ranges, as different frequency ranges may have similar statistical characteristics for its data, and hence use the same encoder. In the illustrated example, there are only two ranges (one partition), corresponding to low (mostly non-zero coefficients) and high (mostly zero coefficients) frequency ranges. Hence, the mostly zero data past the partition is encoded with an RLE type encoder (see, e.g., FIG. 13), and the data before the partition is encoded with a variable-to-variable entropy-type entropy encoder.

In the general case, however, once statistical information is available for a particular input, different encoders may be selected according to whichever encoder is best able to compress an input. For example, encoding methods, such as traditional Huffman encoding, vector Huffman variants, RLE encoding, etc., can be optimized and their code books trained for input having certain characteristics such as high spectral values, low spectral values, mixed or alternating spectral values, or some other desired/probable feature. In contrast with prior use of a single encoder for all input, illustrated configurations match different encoding methods according to a best match between a statistical profile for an input and the statistical profile for data on which an encoder code book was trained.

After determining which encoder 402–406 to use, processing continues as discussed with respect FIG. 2 for transmitting data to a receiver 216 for decoding. Note that an inverse mode selector is not shown. A mode switcher is necessary (e.g., as part of the FIG. 2 decoder 212) to properly select an appropriate decoder to reverse the work of the mode selector 400. However, as discussed above, range divider locations can be determined in advance, thus leaving their identification implied during decoding. Or, for dynamic adaptive encoding/decoding, embedded flags may be used to trigger decoder selection. Using flags is equivalent to using a mode selector, and the mode selector can be designed to operate for both pre-determined and adaptively located partitions.

Figure 5:
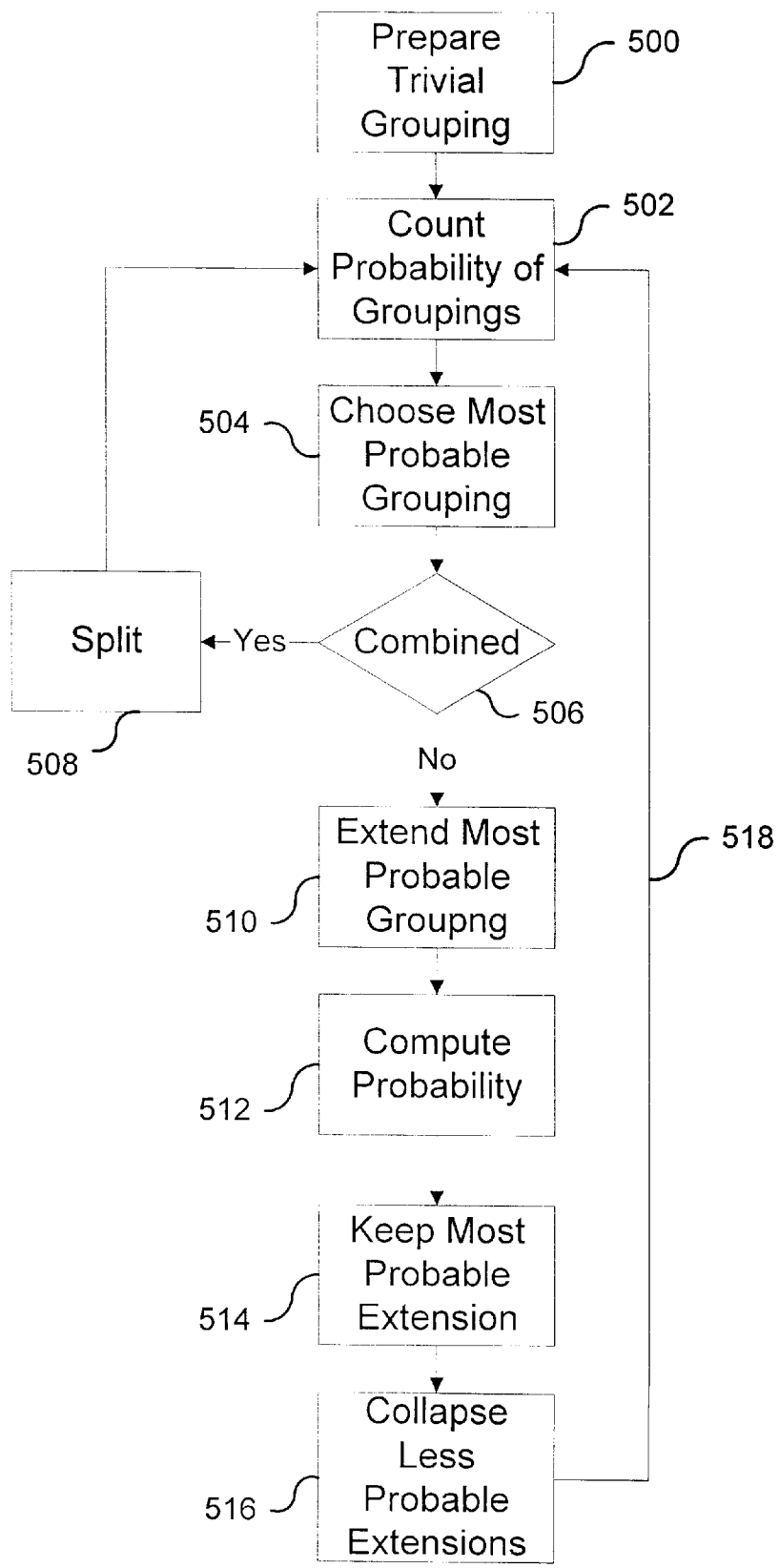
FIG. 5 is a flowchart showing creation of a code book having variable length entries for variable length symbol groupings.

FIG. 5 is a flowchart showing a preferred method for generating an entropy encoder's code book for input having a high probability of non-zero frequency coefficients. In particular, and in contrast with prior art techniques, FIG. 5 illustrated creating a code having variable length code assignments for variable length symbol groupings. (Prior art techniques either require fixed-length codes or fixed-length blocks of input.) Preferred implementations overcome the resource requirements of large dimension vector encoding, and the inapplicability of coding into words of equal lengths, by providing an entropy based variable-to-variable code, where variable length code words are used to encode variable length X sequences. Resource requirements can be arbitrarily capped by setting a fixed maximum code book size. This code book is created as follows.

Let $y_i$ represent each source symbol group $\{x_j\}$, for $1<=j<=N_i$, having probability $P_i$ of occurring within the input stream, and each group is assigned a corresponding code word having $L_i$ bits. Assuming that each $x_j$ is drawn from a fixed alphabet of predetermined size, the objective is to $$\text{minimize the equation } L = \sum_i \frac{L_i * P_i}{N_i}.$$

Instead of finding a general solution to the problem, the problem is separated into two different tasks. The first task is identification of a (sub-optimal) grouping of a set of input symbols $\{x_i\}$ through an empirical approach described below. The second task is assigning a entropy-type code for the grouped symbols $\{y_i\}$. Note that it is known that if the source is not coherent (i.e., the input is independent or without memory), any grouping that has the same configuration of $\{N_j\}$ can achieve the same coding efficiency. In this situation, the first task becomes inconsequential.

To perform the first task, an initial trivial symbol grouping 500 is prepared, such as $\{y_i\}=\{x_i\}$. This initial configuration assumes that an exemplary input stream is being used to train creation of the code book. It is understood that a computer may be programmed with software constructions such as data structures to track receipt of each symbol from an input. Such data structures may be implemented as a binary-type tree structure, hash table, or some combination of the two. Other equivalent structures may also be used.

After determining the trivial grouping, the probability of occurrence for each $y_i$ is computed 502. Such probability is determined with respect to any exemplary input used to train code book generation. As further symbols are added to the symbol data structure, the probabilities are dynamically adjusted.

Next, the most probable grouping $y_i$ is identified 504 (denoted as $y_{mp}$). If 506 the highest probability symbol is a grouping of previously lower probability symbols, then the grouping is split 508 into its constituent symbols, and processing restarted from step 502. (Although symbols may be combined, the group retains memory of all symbols therein so that symbols can be extracted.)

If the symbol is not a grouping, then processing continues with step 510, in which the most probable grouping is then tentatively extended with single symbol extensions $x_i$'s. Preferably $y_{mp}$ is extended with each symbol from the X alphabet. However, a predictor can be used to only generate an extension set containing only probable extensions, if the alphabet is very large and it is known many extensions are unlikely. For example, such a predictor may be based on semantic or contextual meaning, so that very improbable extensions can be ignored a priori.

The probability for each tentative expansion of $y_{mp}$ is then computed 512, and only the most probable extension retained 514. The rest of the lower probability extensions are collapsed together 516 as a combined grouping and stored in code book with a special symbol (event) to indicate a combined grouping. This wild-card symbol represents any arbitrary symbol grouping having $y_{mp}$ as a prefix, but with an extension (suffix) different from the most probable extension. That is, if $y_{mp}+x_{mp}$ is the most probable root and extension, then the other less probable extensions are represented as $y_{mp}*$, $*x_{mp}$. (Note that this discussion presumes, for clarity, serial processing of single-symbol extensions; however, parallel execution of multiple symbol extensions is contemplated.)

It is understood by one skilled in the art that applying single symbol extensions, and keeping only one most probable grouping, are restrictions imposed for clarity of discussion. It is further understood that although discussion focuses on serial processing, code book construction may be paralleled.

Code book construction is completed by repeating 518 steps 502–516 until all possible extensions have been made, or the number of the code book entries reaches a predetermined limit. That is, repeating computing probabilities for each current $y_i$ 502, where the code book set $\{Y\}$ now includes $y_{mp}+x_{mp}$, and respectively choosing 504 and grouping the most and least likely extensions. The effect of repeatedly applying the above operations is to automatically collect symbol groupings having high correlation, so that inter-group correlation is minimized. This minimizes the numerator of L, while simultaneously maximizing the length of the most probable $y_i$ so that the denominator of L is maximized.

FIGS. 6–13 illustrate creation of a code book pursuant to FIG. 5 for an exemplary alphabet $\{A, B, C\}$. For this discussion, the code book is defined with respect to an exemplary input stream "A A A B B A A C A B A B B A B". As discussed above, one or more exemplary inputs may be used to generate a code book that is then used by encoders and decoders to process arbitrary inputs. For clarity, the code book is presented as a tree structure, although it may in fact be implemented as a linear table, hash table, database, etc. As illustrated, the tree is oriented left-to-right, where the left column (e.g., "A" and "XO") represents the top row of a tree-type structure, and successively indented rows represent the "children" of the previous row's node (e.g., in a top-down tree for FIG. 7, top node "A" is a first-row parent node for a second-row middle-child node "B".).

In preparing the code cook, the general rule is to pick the most probable leaf node, expand it, re-compute probabilities to determine the most probable leaf-node, and then compact the remaining sibling nodes into a single Xn node (n=0 . . . N, tracking each time nodes have been combined). If it turns out that the most probable node is a group node, then the group is split, probabilities recalculated, and the most probable member node retained (i.e., the remaining group members are re-grouped). Processing cycles until a stop state is reached, such as a code book having predetermined size.

Figure 6:
FIGS. 6–12 illustrate creation of a code book pursuant to FIG. 5 for an alphabet {A, B, C}.

FIG. 6 shows an initial grouping for the input stream "A A A B B A A C A B A B B A B". An initial parsing of the input gives probabilities of occurrence of A=8/15, B=6/15, and C=1/15. This initial trivial grouping can be created based on different criteria, the simplest being having a first-level node for every character in the alphabet. However, if the input alphabet is large, the trivial grouping may be limited to some subset of symbols having highest probability, where the remaining symbols are combined into an X grouping. FIG. 6 illustrates this technique by starting with only two initial groups, group A 600 having probability 8/15, and group X0 602 having probability 7/15, where X0 represents all remaining low probability symbols in the alphabet, e.g., B and C.

Figure 7:
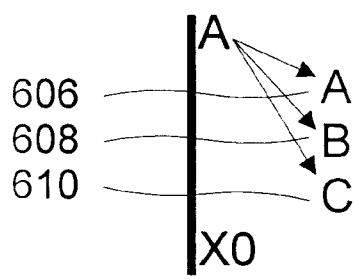

After preparing an initial trivial grouping, the leaf-node having highest probability is selected for extension (see also FIG. 5 discussion regarding processing sequence). Hence, as shown in FIG. 7, group A 600 is tentatively expanded by each character in the alphabet (or one may limit the expansion to some subset thereof as described for creating the initial grouping). Probabilities are then recomputed with respect to the input stream "A A A B B A A C A B A B B A B" to determine values for the tentative extensions A 606, B 608, and C 610. The result is nine parsing groups, where "A A" appears 2/9, "A B" appears 4/9, and "A C" appears 0/9. Therefore, the most probable extension "A B" is retained and the other extensions collapsed into X1=A,C. Note that although this discussion repeatedly recalculates all probabilities, a more efficient approach is to retain probabilities and symbol associations for each node within the node, and only computing information as necessary.

Figure 8:
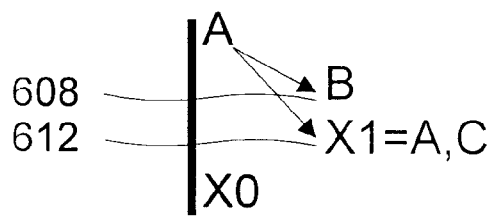

FIG. 8 shows the collapse into X1 612 for FIG. 7. Processing repeats with identification of the node having highest probability, e.g., node B 608 at probability 4/9.

Figure 9:
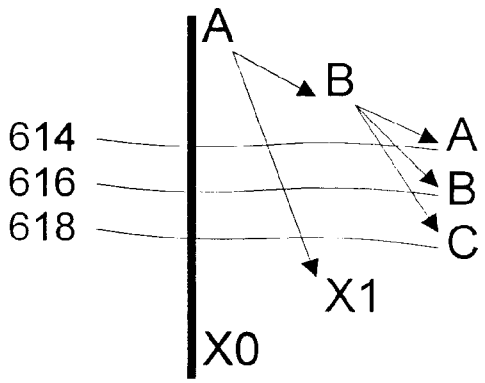

As shown in FIG. 9, this node 608 is tentatively extended with symbols A 614, B 616, C 618, and as discussed above, the tentative grouping with highest probability is retained. After recalculating probabilities, the result is eight parsing groups in which the symbol sequence "A B A" 614 appears once, "A B B" 616 appears once, and "A B C" 618 does not appear at all. Since tentative extensions A 614 and B 616 have the same probability of occurrence, a rule needs to be defined to choose which symbol to retain. For this discussion, whenever there are equal probabilities, the highest row node (e.g., the left-most child node in a top-down tree) is retained. Similarly, when there is a conflict between tree rows, the left-most row's node (e.g., the node closest to the root of a top-down tree) is retained.

Figure 10:
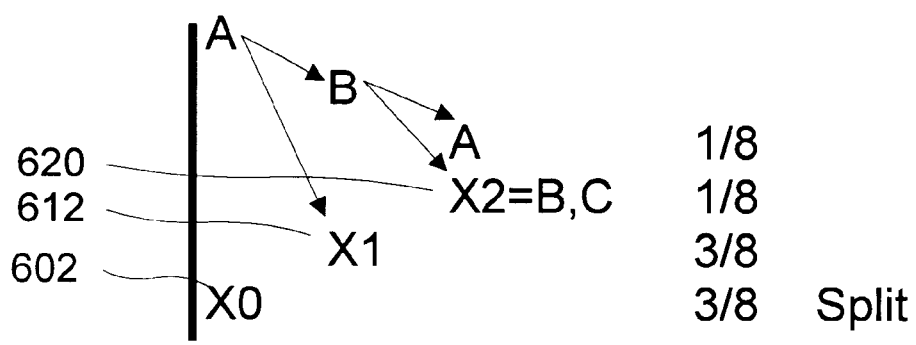

Therefore, as shown in FIG. 10, node A 614 (FIG. 9) is retained and nodes B 616 and C 618 are combined into node X2=B,C 620, having combined probability of 1/8+0/8. Now, the next step is to expand the node currently having highest probability with respect to the input stream. As shown, nodes X1=A,C 612 and X0=B,C 602 have the same probability of occurrence (3/8). As discussed above, a default rule is used so that the highest node in the tree (X0 602) is extended. (Although it is only necessary to be consistent, it is also preferable to expand higher level nodes since this may increase coding efficiency by increasing the number of long code words.)

However, X0 602 is a combined node, so it must be split instead of extended. FIG. 11 illustrates the result of splitting node X0 into its constituent symbols B 622 and C 624. Recalculating probabilities indicates that symbol sequences "A B A" appears 1/8, "A B X2" appears 1/8, "A X1" appears 3/8, "B" 422 appears 2/8, and "C " appears 1/8. Since this is a split operation, the split node having highest probability, e.g., node B 622, is retained, and the remaining node(s) re-combined back into X0 602.

FIG. 12 shows the result of retaining high-probability node B 622. Note that grouping X0 602 now only represents a single symbol "C". After revising probabilities, the node having highest probability must be identified and split or extended. As shown, symbol sequence "A B A" appears 1/8, "A B X2" appears 1/8, "A X1" appears 3/8, "B" appears 2/8, and "X0 " appears 1/8. Therefore node X1 612, as a combined node, must be split.

Splitting proceeds as discussed above, and processing the input cycles as discussed above in conjunction with FIG. 5, where highest probability nodes are extended or split until a stop state is reached (e.g., the code book reaches a maximum size). Once the code book has reached a stop state, it is available for encoding data to transmit over a communication channel.

FIG. 13 illustrates a threshold grid that can be used to modify the FIG. 5 method of code book generation. As discussed for FIGS. 3 and 4, encoding becomes more efficient when encoders can be tailored to process certain portions of the input data. In particular, when it is known that the encoding method will produce a significant number of repeating values, an entropy coder can be combined with RLE-type encoding to increase coding efficiency for data containing the repeated value.

In the illustrated embodiments, quantization of the input data introduces zero or near-zero spectral coefficients for significant portions of the frequency ranges for the input data. Consequently, rather than applying the same entropy coder used for the mostly non-zero data (e.g., the encoder and code book of FIG. 5), instead a RLE-based entropy coder is used.

To construct a code book for a RLE-based entropy encoder, let the absolute values of the non-zero spectral samples form an integer set $L_i=\{1, 2, 3, \ldots, L_n\}$ where $L_n$ stands for any value that is greater than or equal to $L_n$. Let the run length of zero spectral samples in an input stream form another set $R_j=\{1, 2, 3, \ldots, R_m\}$ with $R_m$ stands for any zero runs with length longer than or equal to $R_m$. Using this notation, we can represent an input spectrum with a string of input symbols defined as $(R_i, L_j)$, which corresponds to $R_i$ zero spectral samples followed by $L_j$ (i.e., symbols encoded with the entropy encoder).

As described above for FIG. 5 et seq., the first step in constructing a code book is to collect the probability of all input events. Here, the input is adjusted with respect to defined thresholds, and therefore probability is determined for $(R_i, L_j)$ for all $1<=i<=n$ and $1<=j<=m$. These probabilities are pictorially presented in FIG. 13, in which darker squares (e.g., 806, 808) correspond to events having higher probability, and lighter squares (e.g., 810, 812) have low or near zero probability. All high probability input configurations are collectively referenced as range 800, and all low probability configurations as range 802. All low probability combinations are excluded from the code book. A probability threshold 804 is defined such that any value below the divider is set to zero and excluded from the code book. Remaining above-threshold configurations are assigned a entropy-type code having length inversely proportional to its probability. For quantized audio data, high amplitude inputs have low probability. Consequently, they fall below the threshold and are excluded from the code book (however, they can be escaped and placed in the encoded bit stream).

In order to interleave entropy coding output with use of a secondary encoder, a special entropy code book code is reserved to demark excluded events (e.g., RLE encoded data). At encoding time, spectral samples (input symbols) can be are compared to the list of possible events and if a match is found (e.g., if using a variable to variable encoder, in the tree, table, hash structure or equivalent used to represent the code book), the corresponding entropy-type code is output followed by a sign bit.

If a match is not found, the escape code is sent followed by necessary information to identify the event, i.e., information for the RLE encoding of the data. In the case of an input spectrum ending with N zeros, either an explicit (special) ending signal is needed or a special event such as (N, 1) suffices because the decoder is aware the total number of samples and able to stop decoding when that limit is exceeded.

For decoding, a threshold grid is not required, as the grid is used to cull code book entries. Decoding methods disclosed herein can be used along with a FIG. 13 code book generated as described.

Figure 14:
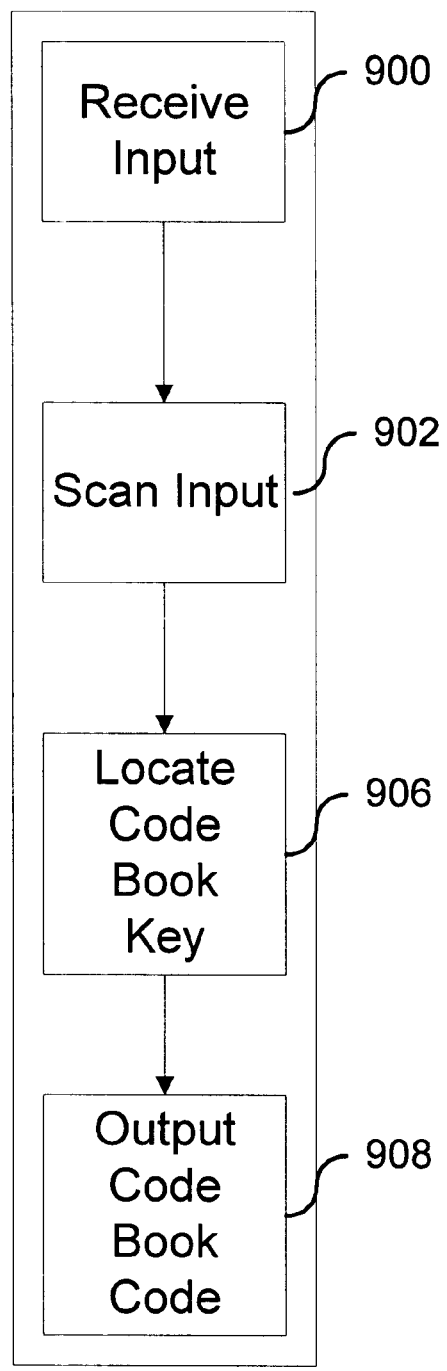
FIG. 14 illustrates implementing the FIG. 2 entropy encoder.

FIG. 14 shows one method for implementing the entropy encoder 208 of FIG. 2 through application of a code book derived according to FIG. 5 to quantized data. (Note that the variable-to-variable encoding method is generally applicable for encoding other types of data.) As illustrated, the quantized data is received 900 as input to the entropy encoder of FIG. 2. It is understood that the input is in some form of discrete signals or data packets, and that for simplicity of discussion, all input is simply assumed to be a long series of discrete symbols. The received input 900 is scanned 902 in order to locate a corresponding code book key in the code book of FIG. 5. Such scanning corresponds to a data look-up, and depending on how the data structure used to implement the code book, the exact method of look-up will vary.

Note that there are various techniques available for storing and manipulating an encoder's code book. For example, one structure for a variable to variable code book is traversal and storage of a N-ary (e.g., binary, tertiary, etc.) tree, where symbol groupings guide a traversal of the tree structure. The path to a leaf node of the tree represents the end of a recognized symbol sequence, where a entropy-type code is associated with the sequence. (Note that the code cook may be implemented as a table, where a table entry contains the entire input sequence, e.g., the path to the node.) Nodes can be coded in software as a structure, class definition, or other structure allowing storage of a symbol or symbols associated with the node, and association of a corresponding entropy-type code 906.

Or, for the RLE encoder, its code book can be stored as a two-dimensional grid in permanent storage, where data retrieval is performed by identifying two indices. Thus, one can retrieve table entries by specification of a run-length and a particular symbol value. A decoding table can be implemented as a Huffman tree. Another code book implementation includes Rice-Golomb structures, and their equivalents.

Although not explicitly illustrated, as discussed with respect to FIG. 2, decoding operates as an inverse operation of encoding, where the encoded data 908 is looked up 906 in a decoding code book, in order to produce an approximation of the original input frequency coefficients 900.

Having described and illustrated the principles of my invention with reference to an illustrated embodiment, it will be recognized that the illustrated embodiment can be modified in arrangement and detail without departing from such principles. Accordingly, we claim as the invention all such modifications as may come within the scope and spirit of the following claims and equivalents thereto.

What is claimed is:

1. A method of encoding a sequence of audio data frequency coefficients with two or more different entropy encoders, the method comprising:

partitioning a one-dimensional frequency domain range for a sequence of audio data frequency coefficients into at least first and second frequency domain sub-ranges so as to facilitate entropy encoding coefficients of different frequency domain sub-ranges with different entropy encoders, such partitioning made according to statistical analysis identifying separate frequency domain sub-ranges based upon entropy coding efficiency;

encoding coefficients of the first frequency domain sub-range with a first entropy encoder; and encoding coefficients of the second frequency domain sub-range with a second entropy encoder.

2. A method according to claim 1, wherein the statistical analysis measures resultant bit-rate of encoding the sequence of audio data frequency coefficients with the first and second entropy encoders.

3. A method according to claim 2, wherein the coefficients of the first frequency domain sub-range have primarily non-zero values, and wherein the coefficients of the second frequency domain sub-range have primarily zero values.

4. A method according to claim 2, wherein the second entropy encoder includes a run-length entropy encoder used to encode coefficients of the second frequency domain sub-range.

5. A method according to claim 2 wherein the first entropy encoder includes a variable-to-variable entropy encoder used to assign variable length entropy codes to arbitrarily long sequences of coefficients of the first frequency domain sub-range.

6. A method according to claim 2 wherein the statistical analysis is performed in real time.

7. A method according to claim 1, wherein the statistical analysis measures resultant bit-rate of encoding an exemplary sequence of audio data frequency coefficients with the first and second entropy encoders.

8. A method according to claim 7, wherein the coefficients of the first frequency domain sub-range have primarily non-zero values, and wherein the coefficients of the second frequency domain sub-range have primarily zero values.

9. A method according to claim 7, wherein the second entropy encoder includes a run-length entropy encoder used to encode coefficients of the second frequency domain sub-range.

10. A method according to claim 7 wherein the first entropy encoder includes a variable-to-variable entropy encoder used to assign variable length entropy codes to arbitrarily long sequences of coefficients of the first frequency domain sub-range.

11. A method according to claim 1, further comprising preparing a first code book for the first entropy encoder, and preparing a second code book for the second entropy encoder.

12. A computer readable medium having stored thereon instructions for directing a computer to perform the method of claim 1.

13. A method according to claim 1, wherein each encoder uses a code book generated for encoding coefficients sharing a similar statistical profile.

14. A method of decoding a sequence of encoded audio frequency coefficients with two or more different entropy encoders, the method comprising:

receiving a coded audio input sequence having a one-dimensional frequency domain range partitioned into at least first and second frequency domain sub-ranges for entropy decoding with different entropy decoders, each of the first and second frequency domain sub-ranges having an associated entropy decoder, wherein range partitions are predetermined, and wherein selection of an appropriate associated decoder is automatic according to the frequency domain sub-range of the coefficients being decoded;

decoding coefficients of the first frequency domain sub-range with a first associated entropy decoder; and decoding coefficients of the second frequency domain sub-range with a second associated entropy decoder.

15. A method according to claim 14, wherein the second entropy decoder includes a run-length entropy decoder.

16. A computer readable medium having stored thereon instructions for directing a computer to perform the method of claim 14.

17. A method of entropy encoding a sequence of audio data frequency coefficients with at least two different entropy encoders, such coefficients having a minimum and a maximum amplitude, the method comprising:

preparing a first code book for a first entropy encoder;

preparing a second code book for a second entropy encoder optimized for encoding repeating coefficients of a single value;

partitioning a one-dimensional frequency domain range for a sequence of audio data frequency coefficients into at least first and second frequency domain sub-ranges so as to facilitate entropy encoding coefficients of different frequency domain sub-ranges with different entropy encoders, such partitioning made according to a statistical analysis identifying separate frequency domain sub-ranges based upon results of coding with the first and second entropy encoders;

encoding coefficients of the first frequency domain sub-range with the first entropy encoder; and encoding coefficients of the second frequency domain sub-range with the second entropy encoder.

18. A method according to claim 17, wherein the second entropy encoder includes a run-length entropy encoder.

19. A computer readable medium having stored thereon instructions for directing a computer to perform the method of claim 17.

20. A system for encoding an input signal with multiple encoding methods according to characteristics of the input signal, the system comprising:

means for receiving a time-domain audio input signal;

means for converting the time-domain audio signal to a frequency-domain audio signal;

means for quantizing the frequency-domain signal into quantized symbols; and means for selecting an entropy encoder for the quantized symbols based upon spectral frequency of the quantized symbols, wherein the means for selecting associates one of plural different entropy encoders with a spectral frequency depending upon a probability that quantized symbols of the spectral frequency share a value, said associations initially set to minimize output bit-rate of encoding with the different entropy encoders.

21. A system according to claim 20, in which there are at least two different entropy encoders, the system further comprising:

means for partitioning the spectral frequency according to the probability.

22. A computer readable medium having stored thereon computer-executable instructions for performing a method of encoding audio data with an entropy encoder, the entropy encoder adaptively switching entropy coding modes between frequency domain sub-ranges, the method comprising:

setting one or more entropy coding mode boundaries in a one-dimensional frequency domain range, wherein each entropy code mode boundary partitions the frequency domain range into plural frequency domain sub-ranges for encoding with different entropy encoding modes, each entropy coding mode boundary for separating audio data that satisfies a statistical criterion from audio data that fails the statistical criterion, the one or more entropy coding mode boundaries initially set to minimize output bit-rate of encoding with the different entropy encoding modes;

based upon the one or more entropy coding mode boundaries, selecting entropy coding modes to apply to audio data; and encoding the audio data with the selected entropy coding modes.

23. The computer readable medium of claim 22 wherein the statistical criterion is likelihood of audio data being zero value audio data.

24. The computer readable medium of claim 22 wherein the setting occurs adaptively with respect to the audio data being encoded.

25. The computer readable medium of claim 24 further comprising:

embedding a mode-selection flag within a stream of encoded audio data upon an entropy coding mode change, wherein the mode-selection flag indicates a frequency domain sub-range change for the encoded audio data.

26. The computer readable medium of claim 22 wherein the setting occurs with respect to exemplary audio data.

27. The computer readable medium of claim 26 wherein a stream of encoded audio data lacks entropy coding mode-selection flags due to a pre-determined association between the plural frequency domain sub-ranges and the different entropy encoding modes.

28. A method of encoding a sequence of time-domain audio data symbols with two or more different entropy encoders into an output data stream, each encoder optimized for data sharing a particular value characteristic, the method comprising:

converting the time-domain data symbols into frequency domain data;

reducing the frequency domain data according to a psychoacoustic model in conjunction with quantizing the frequency domain data;

based upon a frequency domain partition, selecting an entropy encoder to apply to the quantized data, the frequency domain partition selectively set to group frequency domain zones that share a particular value characteristic and to separate frequency domain zones for encoding with different entropy encoders, a first group of frequency domain zones characterized by non-zero-value quantized data, a second group of frequency domain zones characterized by zero-value quantized data, the frequency domain partition set based upon results of coding with the different entropy encoders; and encoding the quantized data with the selected entropy encoder.

29. A method of encoding an arbitrarily long series of audio input coefficients within a one-dimensional frequency domain range, the method comprising:

calculating the probability of coefficients having zero values;

partitioning the one-dimensional frequency domain range into a first frequency domain sub-range and a second frequency domain sub-range to group coefficients having primarily non-zero values into the first frequency domain sub-range, and to group coefficients having primarily zero values into the second frequency domain sub-range;

encoding coefficients of the first frequency domain sub-range with a variable-to-variable entropy encoder; and encoding coefficients of the second frequency domain sub-range with a run-length entropy encoder.

30. A system for encoding an input signal with multiple encoding methods according to characteristics of the input signal, the system comprising:

an input for receiving a time-domain audio input signal;

a signal transformer for converting the time-domain audio signal to a frequency-domain audio signal;

a quantizer for converting the frequency-domain audio signal into quantized symbols; and a mode selector for selecting an entropy encoder for the quantized symbols depending upon one-dimensional frequency domain zones of the quantized symbols, wherein the mode selector adjustably associates a different entropy encoder with each of plural one-dimensional frequency domain zones based upon a value characteristic of the quantized symbols of the one-dimensional frequency domain zone, and said associations between the plural one-dimensional frequency domain zones and the different entropy encoders facilitate decoder-selection without encoder-designating flags.

* * * * *

UNITED STATES PATENT AND TRADEMARK OFFICE
CERTIFICATE OF CORRECTION

PATENT NO.   : 6,300,888 B1
DATED        : October 9, 2001
INVENTOR(S)  : Chen et al.

It is certified that error appears in the above-identified patent and that said Letters Patent is hereby corrected as shown below:

<u>Title page, Item [54] and Column 1, line 1,</u>
"ENTROPHY" should read -- ENTROPY --.

Signed and Sealed this

Third Day of December, 2002

JAMES E. ROGAN
*Director of the United States Patent and Trademark Office*